(12) United States Patent
Gallardo

(10) Patent No.: US 11,041,919 B2
(45) Date of Patent: Jun. 22, 2021

(54) SYSTEM FOR DETERMINING SHAPE OF FLEXIBLE DISPLAY DEVICE

(71) Applicant: Sharp Kabushiki Kaisha, Osaka (JP)

(72) Inventor: Diego Gallardo, Oxford (GB)

(73) Assignee: Sharp Kabushiki Kaisha, Osaka (JP)

(*) Notice: Subject to any disclaimer, the term of this patent is extended or adjusted under 35 U.S.C. 154(b) by 185 days.

(21) Appl. No.: 16/287,009

(22) Filed: Feb. 27, 2019

(65) Prior Publication Data
US 2020/0271737 A1 Aug. 27, 2020

(51) Int. Cl.
| | | |
|---|---|---|
| G01R 33/34 | (2006.01) | |
| H01F 27/28 | (2006.01) | |
| G06F 1/16 | (2006.01) | |
| G01R 33/341 | (2006.01) | |
| H01F 38/14 | (2006.01) | |

(52) U.S. Cl.
CPC ..... *G01R 33/34084* (2013.01); *G01R 33/341* (2013.01); *G06F 1/1652* (2013.01); *H01F 27/28* (2013.01); *H01F 38/14* (2013.01); *H01F 2038/143* (2013.01)

(58) Field of Classification Search
CPC . G01R 33/34084; G01R 33/341; H01F 27/28; H01F 38/14; H01F 2038/143; G06F 1/1652; G06F 1/1616; H05K 5/0086; H01L 51/0097; Y02E 10/549; G09F 9/30
USPC ...... 324/207.11–207.25, 200, 234, 235, 238, 324/240, 256–258, 300, 310–317, 500, 324/520, 600, 633, 667, 674, 681, 707, 324/727
See application file for complete search history.

(56) References Cited

U.S. PATENT DOCUMENTS

| | | | |
|---|---|---|---|
| 2017/0003785 A1* | 1/2017 | Berget | G06F 3/044 |
| 2018/0136762 A1* | 5/2018 | Jeong | G06F 3/0446 |

\* cited by examiner

*Primary Examiner* — Melissa J Koval
*Assistant Examiner* — Trung Q Nguyen
(74) *Attorney, Agent, or Firm* — Renner, Otto, Boisselle & Sklar, LLP

(57) ABSTRACT

A shape sensor is used to determine the shape configuration of a flexible substrate. The shape sensor includes a matrix of coils with a first subset of coils and a second subset of coils; and a controller coupled to the matrix of coils, wherein the controller is configured to generate and transmit an excitation signal to the first subset of coils and measure, on the second subset of coils, an induced signal, and wherein, the controller is configured to determine a spatial configuration of the second subset of coils relative to the first subset of coils based on the induced signal. The shape sensor may be incorporated into a flexible display system so as to determine the degree or state of flexing of the flexible display system.

20 Claims, 10 Drawing Sheets

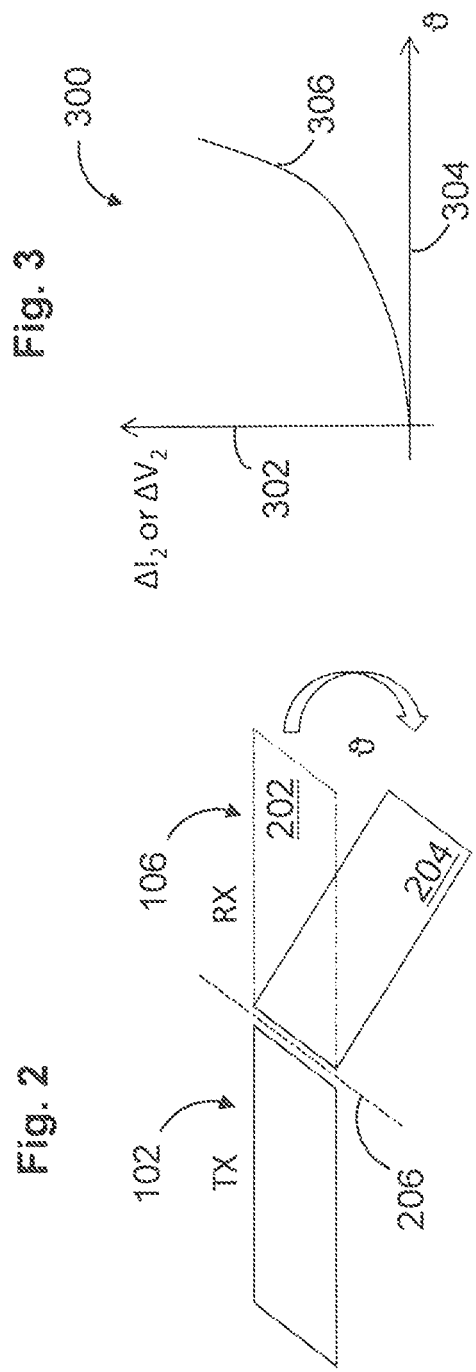

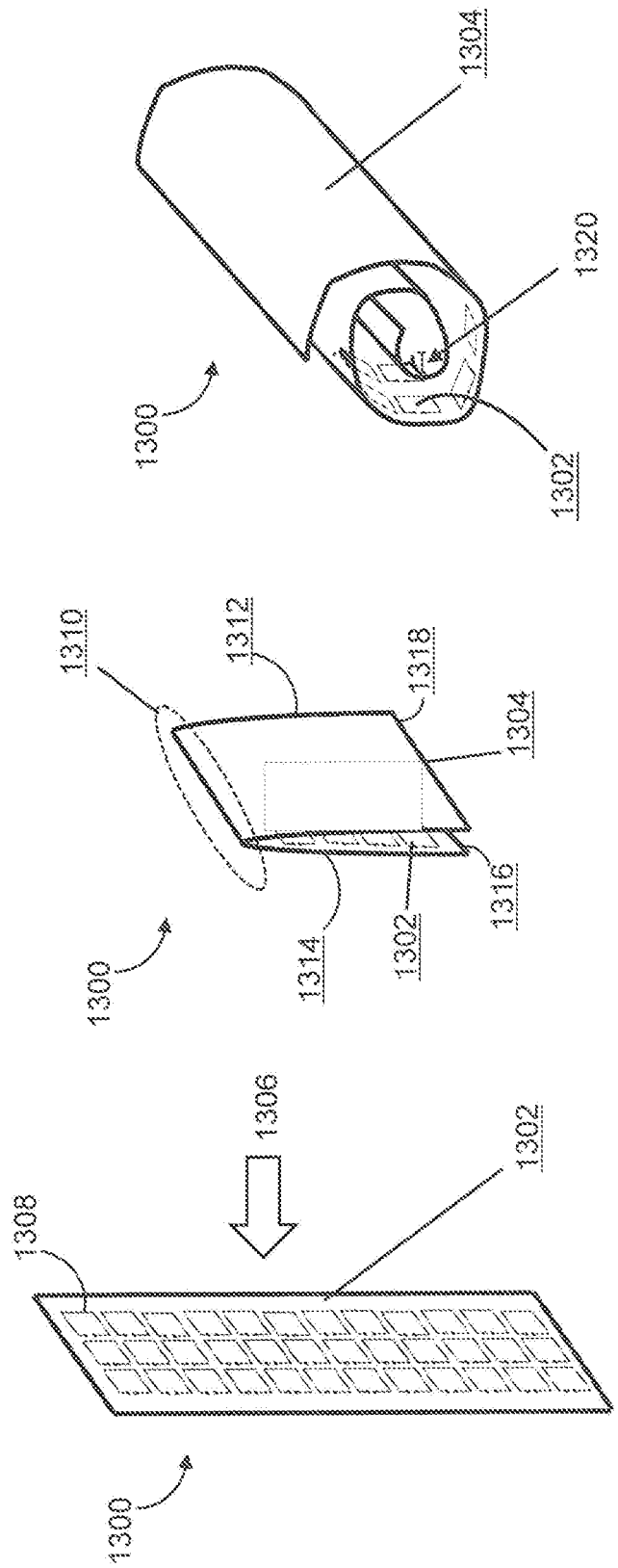

SYSTEM FOR DETERMINING SHAPE OF FLEXIBLE DISPLAY DEVICE

TECHNICAL FIELD

The present disclosure relates generally to determining the spatial configuration of a flexible substrate and, more particularly, to systems for determining the spatial configuration of a flexible substrate using a matrix of coils coupled inductively through their mutual inductance.

BACKGROUND ART

Touch input has become ubiquitous in portable computing devices including mobile phones, gaming systems, and the like. Flexible displays are the next leap in display technology and have been developed with a high degree of substrate flexibility. The substrate shape of a flexible display provides a new interface for user input. For example, a device may determine a deviation of the substrate from a flat plane and take action in response to the deviation. Some conventional flexible displays use sensors such as piezoelectric sensors, magnetic sensors and the like at the edges of a display to detect the current substrate shape. Other conventional flexible displays may position sensors at display hinges and the sensors are limited to determining the current substrate shape along a single axis associated with the hinge. Such conventional systems, however, do not provide a precise indication of the current substrate shape.

SUMMARY OF INVENTION

Accordingly, there is a need for improved methods and systems of determining the spatial configuration of a flexible substrate using deviations of the substrate from a flat plane. The present invention relates to a shape sensor that is capable of detecting deflection of a flexible substrate in a plurality of directions. The shape sensor may be based on mutually coupled inductors. The amount of mutual inductance that links one coil to another depends on the relative positioning of the two coils. A flexible display device may include a matrix of mutually coupled inductors formed on a flexible substrate to detect a current spatial configuration of the substrate. A flexible 2-dimensional (2D) matrix of coils may be coupled through a plurality of mutual inductance coefficients. Each of the plurality of mutual inductance coefficients may be shape dependent, and changes in the substrate geometry may cause changes in the mutual inductances between coils of the 2D matrix of coils. Any change in the mutual inductance will result in changes to any induced signals in the 2D matrix of coils. In various embodiments, induced signals in the 2D matrix of coils may be measured to determine whether the substrate has been flexed, bent, warped, folded, and the like. In some embodiments, the 2D matrix of coils may be coupled to a controller that is configured to measure one or more induced signals and determine one or more mutual inductances, and the spatial configuration of the substrate is based on at least one or more of the induced signals and the mutual inductances.

An aspect of the invention, therefore, is a shape sensor that may be used to determine the shape configuration of a flexible substrate. In exemplary embodiments, the shape sensor may include a matrix of coils with a first subset of coils and a second subset of coils; and a controller coupled to the matrix of coils, wherein the controller is configured to generate and transmit an excitation signal to the first subset of coils and measure, on the second subset of coils, an induced signal, and wherein, the controller is configured to determine a spatial configuration of the second subset of coils relative to the first subset of coils based on the induced signal. The shape sensor may be incorporated into a flexible display system so as to determine the degree or state of flexing of the flexible display system.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIG. 2 is a perspective view of two coils showing deviation from a flat plane in accordance with embodiments of the present invention.

FIG. 3 is a diagram showing a measured output signal relative to the orientation of the coils in accordance with embodiments of the present invention.

FIG. 13A is a schematic drawing depicting an exemplary flexible substrate in accordance with embodiments of the present invention, in a first or planar state.

FIG. 13B is a schematic drawing depicting the exemplary flexible substrate of FIG. 13A in a non-planar state, in which the non-planar state is a folded state.

FIG. 13C is a schematic drawing depicting the exemplary flexible substrate of FIG. 13A in a non-planar or state in which the non-planar state is a rolled state.

DESCRIPTION OF EMBODIMENTS

Figure 1:
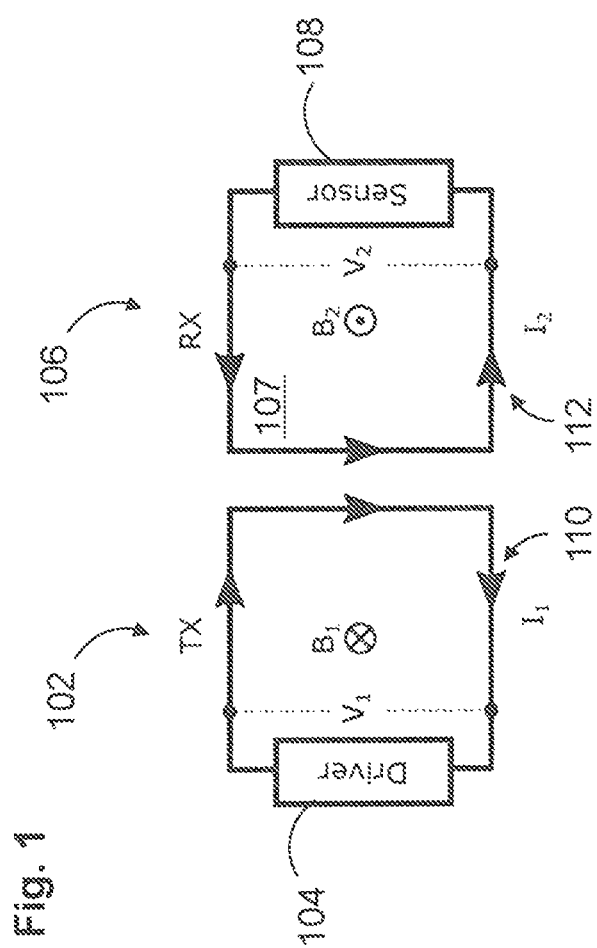
FIG. 1 shows a system of two coils linked by mutual inductance in accordance with embodiments of the present invention.

Embodiments of the present invention will now be described with reference to the drawings, wherein like reference numerals are used to refer to like elements throughout. It will be understood that the figures are not necessarily to scale.

In the drawings, each element with a reference number is similar to other elements with the same reference number independent of any letter designation following the reference number. In the text, a reference number with a specific letter designation following the reference number refers to the specific element with the number and letter designation and a reference number without a specific letter designation refers to all elements with the same reference number independent of any letter designation following the reference number in the drawings.

Mutual Inductance Between Coils

For illustrative purposes, FIG. 1 shows a system of two coils linked by mutual inductance in accordance with embodiments of the present invention. The mutual inductance between two coils may be used to measure deviations of a substrate on which the coils are formed from a flat geometry. The coils may be inductively coupled through their mutual inductance coefficients that are sensitive to variations in the spatial configuration of the coils. The mutual inductance, and subsequent variations in the spatial configuration of the coils, may be determined by a controller that is configured to provide excitation signals to a drive sensor and interprets signals from a sensing circuit. In some embodiments, the controller may be configured to output information regarding the spatial configuration of the sensor.

FIG. 1 includes a first coil 102 that may be coupled to a driver 104 and a second coil 106 that may be coupled to a sensor 108. In some embodiments, the first coil 102 and the second coil 106 may be coupled to a circuit configured to provide both drive and sense capabilities to each coil. The first coil 102 and the second coil 106 may be coupled to one or more signal traces. The driver 104 may provide a drive current, $I_1$ on the first coil 102 in a first direction 110. The drive current $I_1$ creates a magnetic field $B_1$. The direction of the magnetic field $B_1$ is into the page. The magnetic field $B_2$ is out of the page and induces a current, $I_2$ on the second coil 106 in a second direction 112. The first coil 102 and the second coil 106 are coupled through their mutual inductances $M_{12}$. The mutual inductance, $M_{12}$, depends on the magnetic flux created by the first coil 102 penetrating the surface 107 formed by the second coil 106. Accordingly, the mutual inductance between the two coils may be a function of the shapes of the two coils and their orientation with respect to each other. The system may be modelled by the equations below:

$$V_1 = (R_1 + j\omega L_1 + Z_{driver}) \cdot I_1 + j\omega M_{12} I_2 \qquad \text{Eq. 1}$$

$$V_2 = (R_2 + j\omega L_2 + Z_{sensor}) \cdot I_2 + j\omega_{12} I_1 \qquad \text{Eq. 2}$$

where $R_1$ and $R_2$ are the resistance of the first coil 102 and the second coil 106 respectively, $L_1$ and $L_2$ are the inductance of the first coil 102 and the second coil 106 respectively, $Z_{driver}$ is the impedance of the driver 104, $Z_{sensor}$ is the impedance of the sensor 108, $I_1$ and $I_2$ are the current of the first coil 102 and the second coil 106 respectively, $M_{12}$ is the mutual inductance coefficient of the inductive coupling between the first coil 102 and the second coil 106, and w is the frequency of the driving signal.

The first inductance $L_1$ of the first coil 102 and the second inductance $L_2$ of the second coil 106 may be measured and/or calculated, and $V_1$ and $I_1$ may be set to convenient values. $V_2$ and $I_2$ are unknowns and can be calculated from $V_1$ and $I_1$. Because changes in the orientation of the coils will change the mutual inductance, $M_{12}$, the values of $V_2$ and $I_2$ will also change as the orientation changes between the first coil 102 and the second coil 106. $V_2$ and/or $I_2$ may be used to determine the orientation, i.e., spatial configuration, between the first coil 102 and the second coil 106. $V_2$ and $I_2$ may be measured and used to determine the mutual inductance, $M_{12}$, and the mutual inductance may be used to determine the spatial configuration of the first coil 102 and the second coil 106.

FIG. 2 is a perspective view of two coils showing deviation from a flat plane in accordance with embodiments of the present invention. FIG. 2 shows the first coil 102 and the second coil 106 with the second coil in a planar position 202 and a rotated position 204. The orientation of the second coil 106 may be characterized by degrees of rotation, i.e., the angle between the first position 202 and the second position 204, θ. The second coil 106 may be rotated from the first position 202 to the second position 204 around an axis of bending 206. The mutual inductance coefficient, $M_{12}$, may be determined using the equation below:

$$M_{12} = \frac{\int_{s_2} B_1 \cdot ds}{I_1} \qquad \text{Eq. 3}$$

where $s_2$ is the surface enclosed by the second coil 106. As discussed above, and shown by the dot product in equation 3, the mutual inductance, $M_{12}$, is a function of the orientation between the magnetic field created by the current in the first coil and the second coil. Accordingly, when the relative orientation of the first coil 102 and the second coil 106 changes by θ, their mutual inductance coefficient $M_{12}$ also changes. Because the voltage $V_2$ and current $I_2$ induced by the magnetic field $B_1$ created by the current $I_1$ on the first coil 102 depend on the relative orientation, changes in the relative orientation can be monitored by measuring the voltage $V_2$, and/or the current $I_2$ on the second coil 106. The spatial configuration of the coils may be determined using the voltage $V_2$ and/or the current $I_2$.

FIG. 3 is a diagram showing a measured output signal relative to the orientation of the coils in accordance with embodiments of the present invention. The y-axis 302 of the diagram 300 shows the change in current or voltage of the second coil 106. The angle, θ, between a planar position and a rotated position is shown on the x-axis 304 of the diagram 300. The measured output signal 306 of the voltage or current of the second coil is shown on the diagram 300. As shown by the measured output signal 306 in the diagram 300, the changes in the angle θ correspond to a change in $V_2$ or $I_2$. By measuring the voltage across (or current through) the second coil 106 and comparing the measured voltage (or current) to a reference value of coplanar coils, the relative position of the first coil 102 and the second coil 106 can be determined. The measured output from the second coil 106 may be processed by controller coupled to the second coil 106 to improve the determination of orientation changes between the first coil 104 and the second coil 106.

Determining Spatial Configuration of Coils

Figure 4:
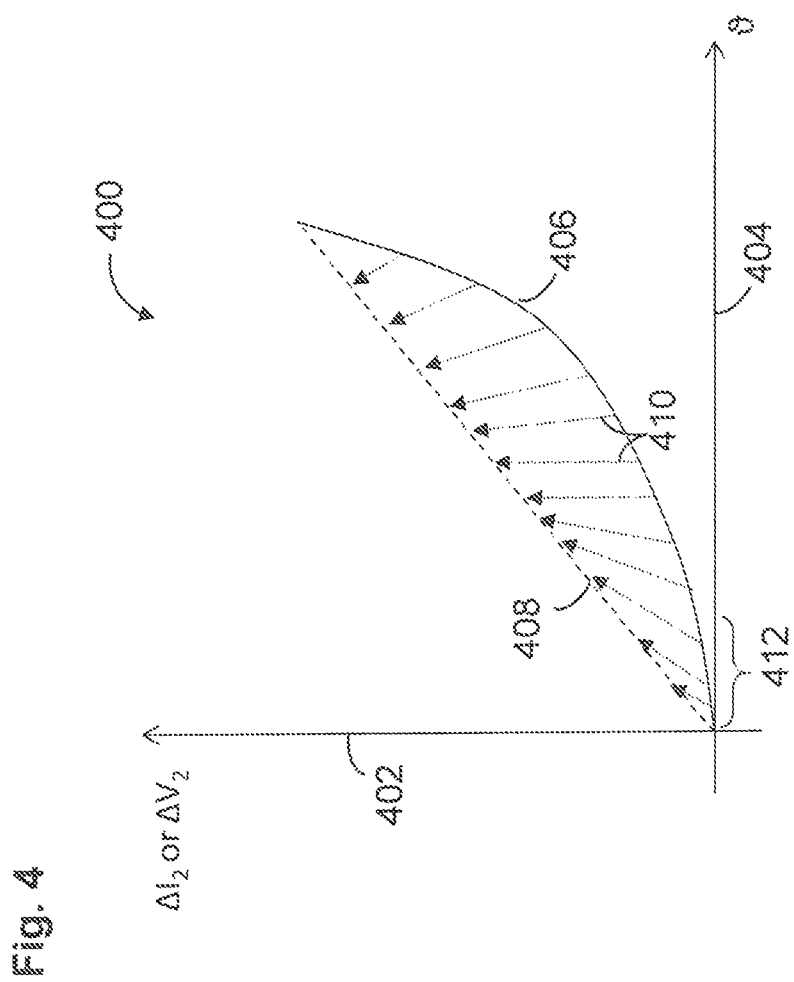
FIG. 4 is a diagram showing the linearization of an output signal from a subset of coils in accordance with embodiments of the present invention.

FIG. 4 is a diagram 400 showing the linearization of an output signal from a subset of coils in accordance with embodiments of the present invention. The y-axis 402 of the diagram 400 shows the change in induced current or induced voltage of the subset of coils. The x-axis 404 of the diagram 400 shows the degrees of rotation, i.e., the angle, θ, between a first subset of coils and a second subset of coils in a planar position and a rotated position. The diagram 400 also includes an output signal 406 representing a change in an induced signal, such as the induced voltage or the induced current associated with the second subset of coils and a linearization 408 of the output signal versus the angle, ϑ.

The system may include a controller and/or processor that is configured to excite a first subset of one or more coils, such as the first coil 102, and determine the output signal 406 associated with a second subset of one or more coils such as the second coil 106. The output signal 406 may be a change in voltage or a change in current associated with the second subset of one or more coils. The controller may include a set of instructions that cause it to perform one or more steps of an algorithm to determine the spatial configuration of a matrix of coils using the angle between the coils and/or an axis of bending. For example, after measuring the output signal 406, the controller may access a linearity table and map 410 the output signal 406 to the linearization 408 to determine an angle between the coils. In some embodiments, the linearity table may correct for nonlinearities present in the output signal 406, and/or may compensate for the small slope of the output signal 406 at low angles 412. The linearity table may be configured to include the axis of bending as a function of the output signal. In embedded systems, the controller may provide the mapped value of an angle and/or an axis of bending to a parent application module for further processing of the angle and/or the axis of bending as an input.

Figure 5:
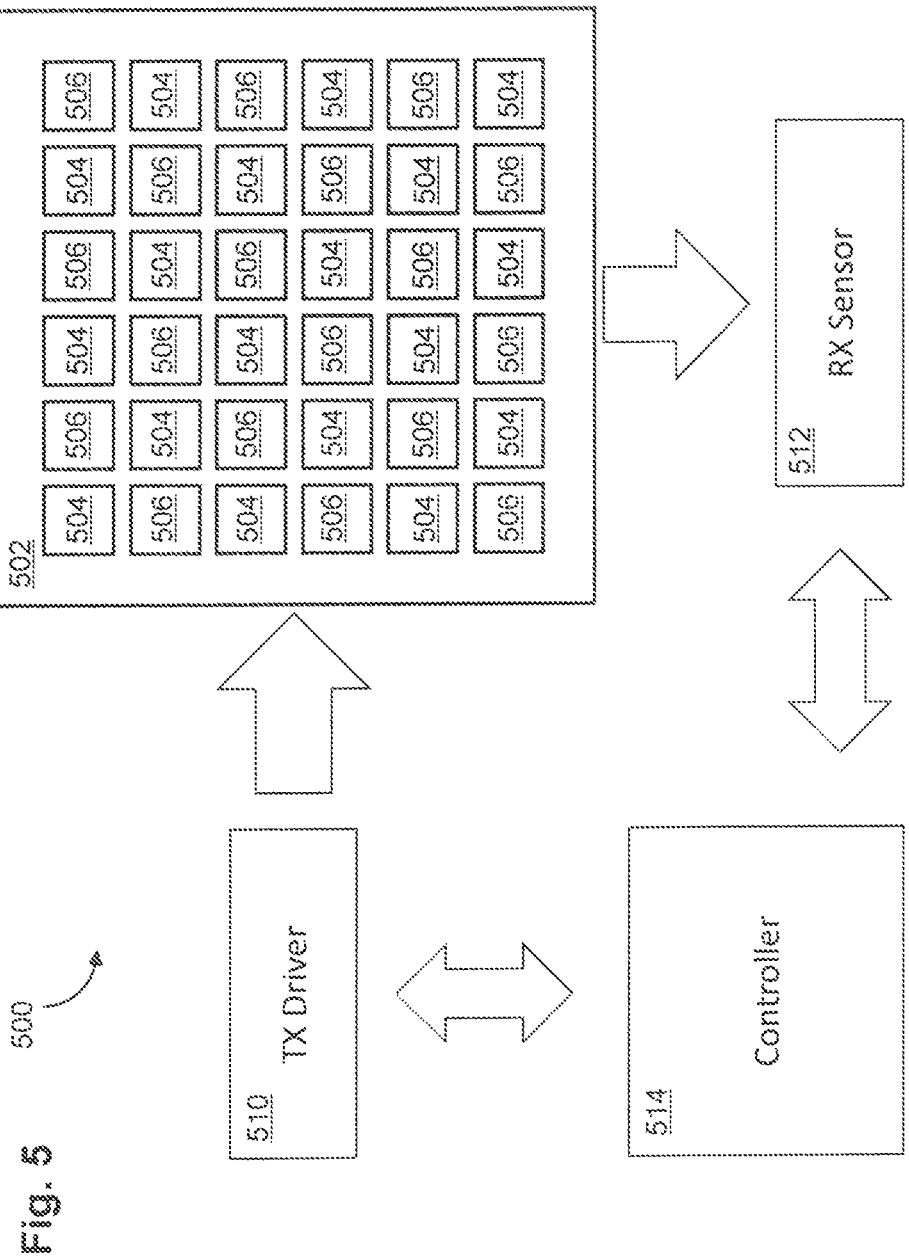
FIG. 5 is schematic drawing depicting an exemplary shape sensor system in accordance with embodiments of the present invention.

FIG. 5 is schematic drawing depicting an exemplary shape sensor system 500 in accordance with embodiments of the present invention. The shape sensor system 500 may be incorporated in an electronic device with a flexible substrate 502 such as an industrial control system, a mobile device, a gaming device, a gaming controller, and the like. The shape sensor system may include a 2D matrix of coils comprising transmit coils 504 and receive coils 506 coplanar with the flexible substrate 502. In some embodiments, the flexible substrate 502 may include a conductive plane parallel with the plane formed by the 2D matrix of coils for reflecting the magnetic field to reduce losses. The individual coils of the 2D matrix of coils may be coupled in series, in parallel, or a combination thereof. While shown in an alternating arrangement in FIG. 5, one of ordinary skill in the art would recognize many variations, modifications, and alternatives to the arrangement of the transmit coils 504 and the receive coils 506. The role of the coils may also be inverted dynamically by the controller if convenient, e.g. the coils 504 may be used as receive coils and the coils 506 as drive coils at certain moments during runtime.

The shape sensor system 500 may include a sensor driver such as transmit driver (TX) 510 coupled to the transmit coils 504, and a receive sensor (RX) 512 coupled to the receive coils 506. The transmit driver 510 may be configured to provide a drive current to one or more coils of the 2D matrix of coils. The shape sensor system 500 may include a controller 514 coupled to the transmit driver 510 and the receive sensor 512. The controller 514 may be configured to generate and transmit an excitation signal to drive the transmit coils 504 and measure a corresponding induced signal on the receive coils 506. The receive sensor 512 may include one or more sensing circuits configured to improve signal quality and measure the induced signal on the receive coils. The induced signal may be processed by the controller 514 to determine any deviations of the flexible substrate 502 from a flat plane. Processing the induced signal may include reading and interpreting signals from the one or more sensing circuits. The controller 514 may be configured to determine the spatial configuration of the flexible substrate 502 by interpreting the signals from the one or more sensing circuits. The spatial configuration may be associated with a particular induced signal. The shape sensor system 500 may include a calibration state in which an induced signal may be associated with a known spatial configuration.

The controller 514 may be configured to execute one or more instructions that may be embodied as computer code stored on a non-transitory computer readable medium. The instructions may include operations such as (1) linearize the measured signal from the receive coils, (2) determine one or more axes of bending, and (3) determine the degrees of rotation of the flexible substrate 502 around the one or more axes of bending. The degrees of rotation and the one or more axes of bending may be used to determine the spatial configuration of the flexible substrate. The controller may be configured to output information associated with the spatial configuration of the flexible substrate to another device, an application, and the like.

One or more of the transmit driver 510, the receive sensor 512, and/or the controller 514 may be embodied in a microprocessor, a field programmable gate array (FPGA), or an application specific integrated circuit. The controller 514 may include or be configured to access a memory (non-transitory computer readable medium), wherein the memory is encoded with instructions that, when executed, cause the shape sensor system 500 to determine the spatial configuration of the flexible substrate and any deviations of the flexible substrate 502 from a flat plane. The memory may include a linearity table that is stored during device fabrication, received by an I/O interface of the controller 514 and stored, and/or during a calibration state. The controller may be configured to update the linearity table that is used to determine the spatial configuration of the flexible substrate 502.

2D-Matrix Coil Arrangements

Figure 6:
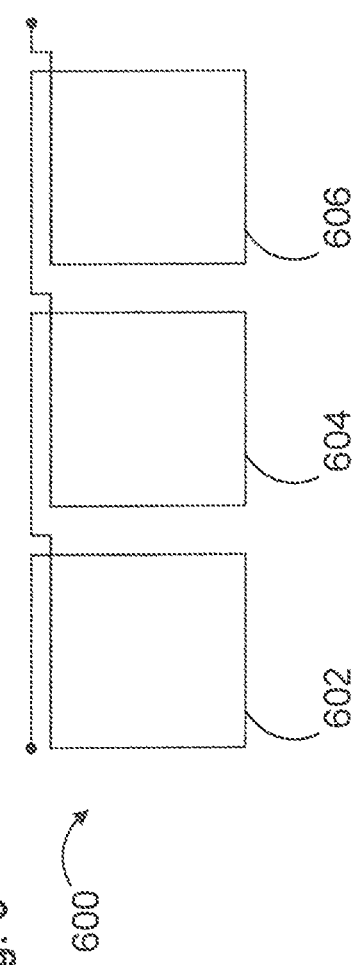
FIG. 6 is a schematic drawing depicting a series coil arrangement in accordance with embodiments of the present invention.

FIG. 6 is a schematic drawing depicting a series coil arrangement 600 in accordance with embodiments of the present invention. The series coil arrangement 600 shows a first coil 602 coupled to a second coil 604 coupled to a third coil 606 connected in series. The coils may include one or more turns, N. The coils may be configured as transmit coils and/or receive coils. Transmit/receive coils may be connected in series, in parallel, or a mixture of these two schemes, depending on the electrical characteristics required from a network and the driving and sensing circuits. The series coil arrangement 600 may be represented by the electrical model shown in FIG. 7.

Figure 7:
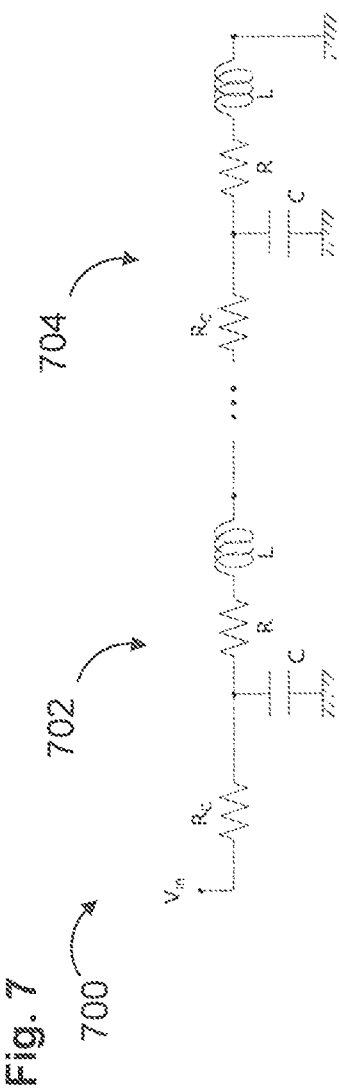
FIG. 7 is a schematic drawing depicting a circuit diagram that corresponds to the 2D series coil arrangement in accordance with embodiments of the present invention.

FIG. 7 is a schematic drawing depicting a circuit diagram 700 that corresponds to a series coil arrangement in accordance with embodiments of the present invention. A first electrical model of a coil 702 and a second electrical model of a coil 704, which may be associated with any number of intervening coils, each includes a resistance, R, and an inductor, L, connected in series, and with a capacitor, C, connected in parallel to ground. The resistance, R, is due to the finite conductivity of the material forming the coil. The capacitance, C, is the parasitic capacitance and depends on the environment of the coil. $R_C$ is the resistance of the segment of conductor connecting sequential coils. The equation below may be used to determine the impedance of a coil:

$$Z_{coil}(\omega) = \frac{R + j\omega L}{1 + j\omega RC - \omega^2 LC} \quad \text{Eq. 4}$$

where ω is the driving frequency of the series coil arrangement. The total impedance of K coils in series is given by the recursive equation:

$$Z_K(K, \omega) = \begin{cases} R_C + Z_{coil}(\omega) & \text{if } K = 1 \\ R_C + \dfrac{R + j\omega L + Z_K(K-1, \omega)}{1 + j\omega C[R_C + R + j\omega L + Z_K(K-1, \omega)]} & \text{otherwise} \end{cases} \quad \text{Eq. 5}$$

To maximize the power delivered to the transmit coils of a matrix, the drive frequency may be selected below a threshold value. The threshold value may be a specific drive frequency, such as a resonance frequency of the transmit coils matrix, beyond which losses through the capacitance dominate the system response to a drive signal.

Figure 8:
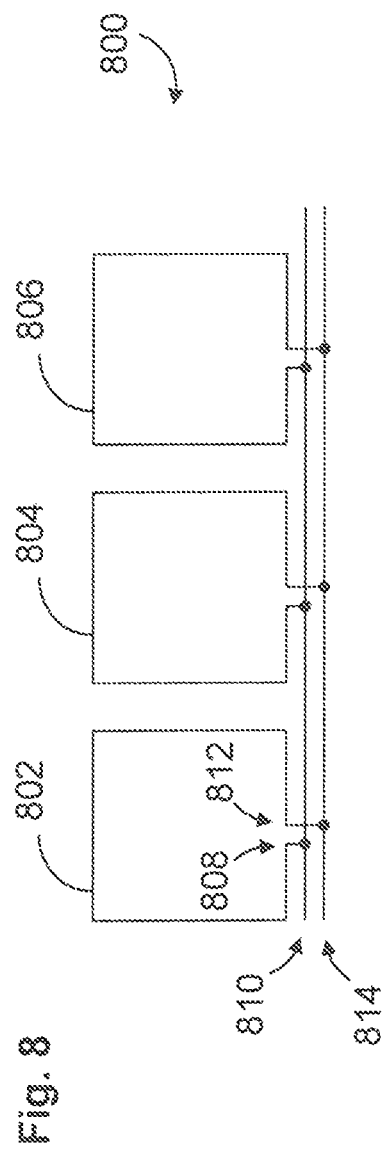
FIG. 8 is a schematic drawing depicting a parallel coil arrangement in accordance with embodiments of the present invention.

FIG. 8 is a schematic drawing depicting a parallel coil arrangement 800 in accordance with embodiments of the present invention. The parallel coil arrangement 800 shows a first coil 802, a second coil 804, and a third coil 806 connected in parallel. A first terminal 808 of each coil is coupled to a first signal trace 810 and a second terminal 812 of each coil is coupled to a second signal trace 814. The first signal trace 810 and the second signal trace 814 can be coupled to a controller that may include a transmit driver and a receive sensor (such as depicted in FIG. 5). The parallel coil arrangement 800 may operate in a drive mode, or a receive mode, or a combination thereof. The parallel arrangement 800 may be represented by the electrical model shown in FIG. 9.

Figure 9:
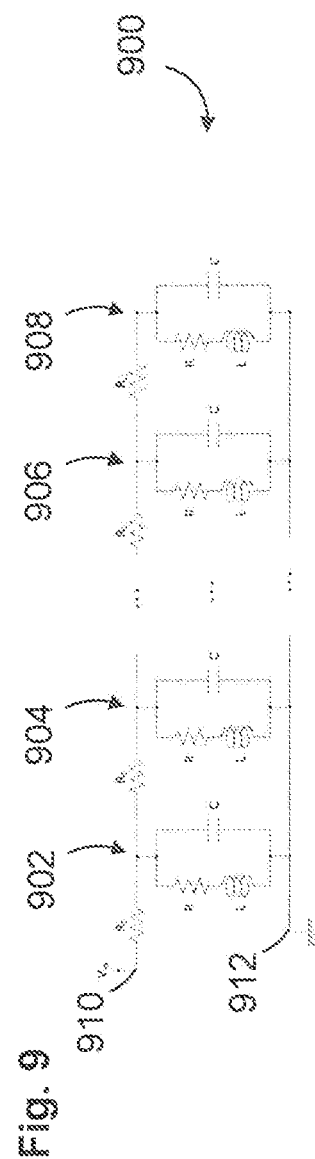
FIG. 9 is a schematic drawing depicting a circuit diagram that corresponds to the 2D parallel coil arrangement in accordance with embodiments of the present invention.

FIG. 9 is a schematic drawing depicting a circuit 900 that corresponds to the parallel coil arrangement in accordance with embodiments of the present invention. The circuit 900 includes a first coil 902, a second coil 904, a third coil 906, and a fourth coil 908, which may be associated with any number of intervening coils, coupled to a first signal trace 910 and a second signal trace 912. The impedance of each individual coil in the circuit 900 is given by equation 4 above. $R_C$ is the resistance of the segment of conductor connecting sequential coils. The total impedance of K coils in parallel is given by the recursive equation:

$$Z_K(K, \omega) = \begin{cases} R_C + Z_{coil}(\omega) & \text{if } K = 1 \\ R_C + \dfrac{1}{\dfrac{1}{Z_{coil}(\omega)} + \dfrac{1}{Z_K(K-1, \omega)}} & \text{otherwise} \end{cases} \quad \text{Eq. 6}$$

To maximize the power delivered to the transmit coils of a matrix, the drive frequency may be selected below a threshold value. The threshold value may be a specific drive frequency, such as a resonance frequency of the transmit coils matrix, beyond which losses through the capacitance dominate the system response to a drive signal.

Figure 10:
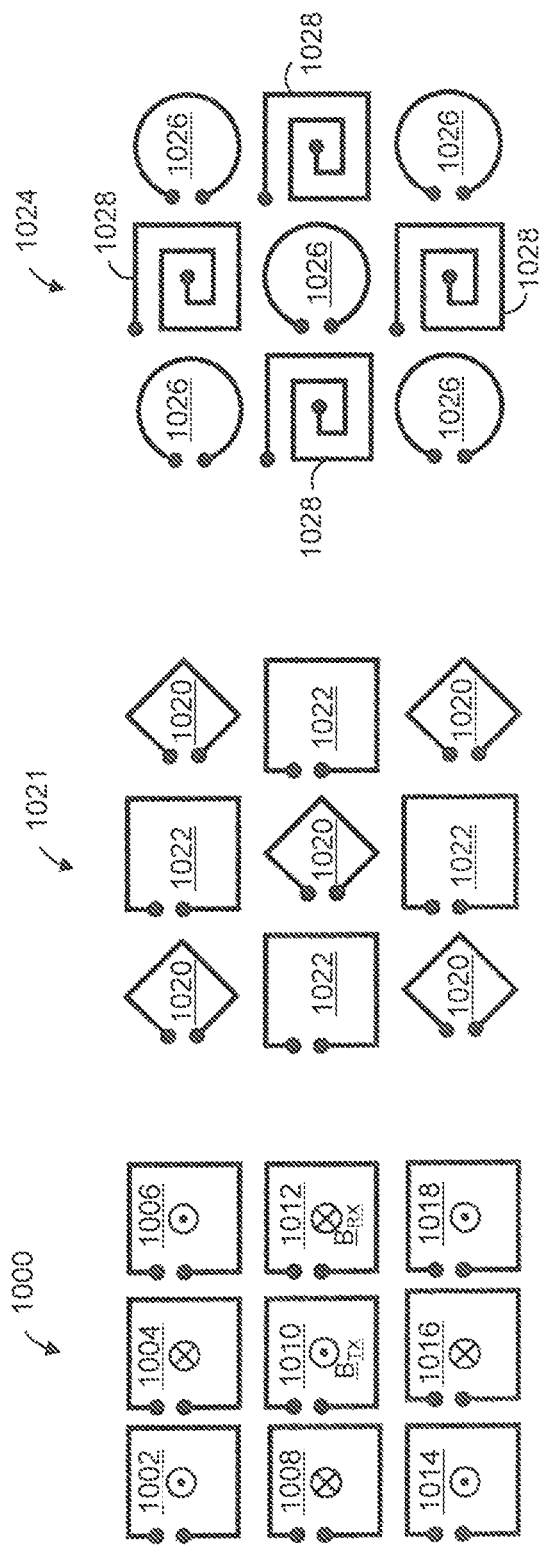
FIGS. 10A, 10B, and 10C are schematic drawings depicting various coil geometries in accordance with embodiments of the present invention.

FIGS. 10A, 10B, and 10C are schematic drawings depicting various coil geometries in accordance with embodiments of the present invention. The coils in each matrix may benefit from having at least 2 axes of quasi-symmetry. This is to maximize isotropy in the signals, i.e., when the sensor is flat, the transmit coils project the same, or approximately the same, level of signal onto their four nearest neighbors, and the receive coils receive the same, or approximately the same, signal level from their four neighbors. A first matrix 1000 in FIG. 10A includes a plurality of coils formed in a first geometry. The plurality of coils may be configured into a first subset of transmit coils 1002, 1006, 1010, 1014, 1018 and a second subset of receive coils 1004, 1008, 1012, 1016. Each coil may include two terminals that are coupled to a signal trace that provides a drive current or senses an induced current on the coil. The signal traces may be coupled to a controller that includes a driver and a receive sensor such as depicted in FIG. 5.

In FIG. 10A, a counter-clockwise current is driven on the transmit coils. The direction of magnetic field, $B_{TX}$, created by the current is out of the page and is shown by the dot symbol in the transmit coils. The magnetic field created by the current driven on transmit coil 1010 will have the largest magnitude at the four nearest neighbors such as receive coils 1004, 1008, 1012, 1016. The direction of the magnetic field, $B_{RX}$, at the nearest neighbors is into the page, and is shown by the cross symbol in the receive coils. The symmetry of the matrix provides approximately the same signal at the receive coils when the matrix 1000 is flat. If any portions of the 2D matrix depart from the flat plane, the magnetic field, and, accordingly, the mutual inductance, will change. The changes in the mutual inductance can be determined and used to detect deflection of the matrix from a flat plane.

FIG. 10B is a schematic drawing depicting a second matrix 1021 comprising a first subset of coils 1020 characterized by a diamond geometry and a second subset of coils 1022 characterized by a rectangular geometry. The diamond geometry may couple more favorably to the square coils than other coil shapes. FIG. 10C is a schematic drawing depicting a third matrix 1024 comprising a first subset of coils 1026 characterized by a circular geometry and a second subset of coils 1028 characterized by a spiral geometry. The spiral geometry increases the number of turns and thus may be more sensitive to current changes, i.e., increased coupling between the coils. The circular geometry may be characterized by a more symmetric response relative to other geometries. In the different geometries, one common-shape coil set may act as the transmit coils and the other common-shaped coil sets may act as the receive signals.

Figure 11:
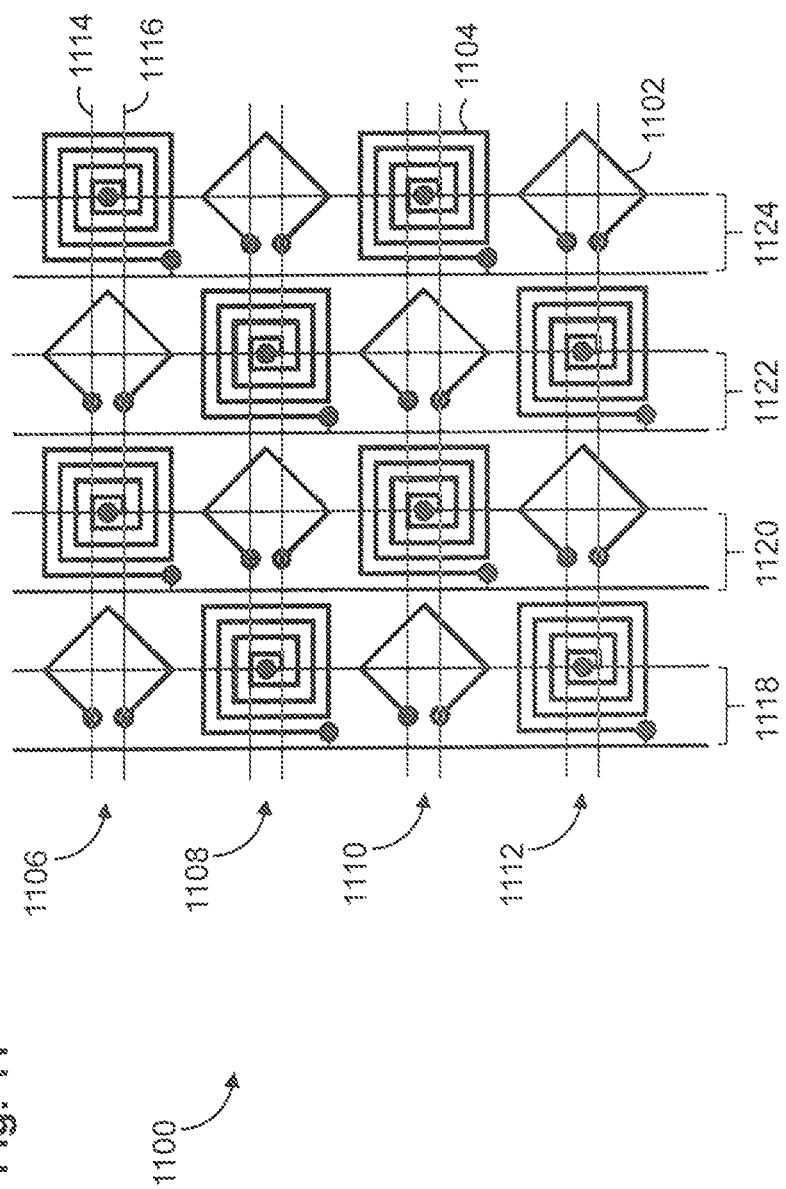
FIG. 11 is a schematic drawing depicting a matrix of coils connected in parallel with signal traces in accordance with embodiments of the present invention.

FIG. 11 is a schematic drawing depicting a matrix 1100 of coils with signal traces in accordance with embodiments of the present invention. The matrix 1100 of coils may include a first subset of coils 1102 characterized by a diamond geometry and a second subset of coils 1104 characterized by a spiral geometry. Each coil includes two terminals. The matrix 1100 may be coupled to a controller by one or more addressing lines. The addressing lines may include one or more signal traces. For a series arrangement, a signal trace may be used to couple the terminals of the coils in a row or column to the controller in series. In a parallel arrangement, a pair for signal traces may be used to couple the coils to the controller in parallel.

For example, matrix 1100 includes a first horizontal addressing line 1106, a second horizontal addressing line 1108, a third horizontal addressing line 1110, and a fourth horizontal addressing line 1112. The coils in the matrix 1100 are coupled to the controller in parallel, so each addressing line includes a first signal trace 1114 and a second signal trace 1116. The horizontal addressing lines may be coupled to the terminals of the first subset of coils 1102 characterized by the diamond geometry. The matrix 1100 also includes a first vertical addressing line 1118, a second vertical addressing line 1120, a third vertical addressing line 1122, and a fourth vertical addressing line 1124. The vertical addressing lines may be coupled to the terminals of the second subset of coils 1104 characterized by the spiral geometry. The horizontal addressing lines may be coupled to a driver, a sensing circuit, or a controller configured to both transmit a drive signal and measure an induced signal. Like the horizontal addressing lines, the vertical addressing lines may be coupled to a driver, a sensing circuit, or a controller configured to transmit a drive signal and measure an induced signal.

Figure 12:
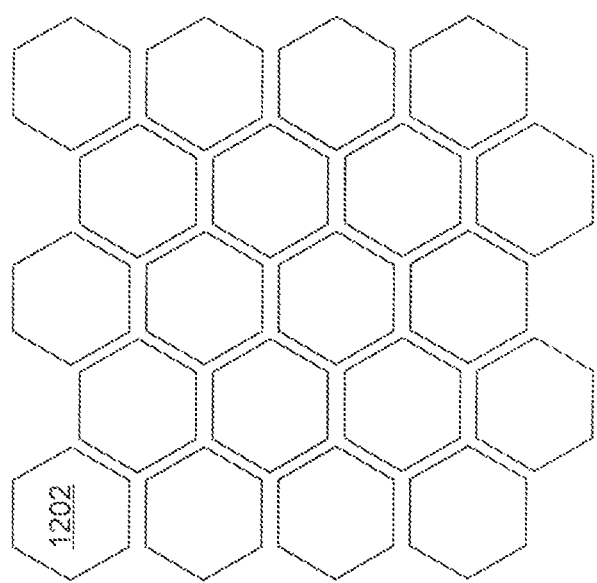
FIG. 12 is a schematic drawing depicting a matrix of hexagonal coils in accordance with embodiments of the present invention.

FIG. 12 is a schematic drawing depicting a matrix 1200 of hexagonal coils 1202 in accordance with embodiments of the present invention. The arrangement of the hexagonal coils 1202 provides a shape sensor with more than two axes of symmetry. The higher order of symmetry may increase the ability of the matrix 1200 to detect one or more axes of bending when the matrix is deflected from a flat plane.

Exemplary Spatial Configurations

FIGS. 13A, 13B, and 13C depict an exemplary flexible display system 1300 configured as a flexible substrate having an image panel in accordance with embodiments of the present invention in a planar state and two non-planar states, for example, a folded state and a rolled state. Referring to FIG. 13A, the flexible substrate/display system 1300 has a first side 1302 and a second side 1304 opposite from the first side (the second side 1304 is not visible from the viewpoint of FIG. 13A). In this example, the first side 1302 is a viewing side relative to a viewing direction 1306, and the second side 1304 is a non-viewing side. A matrix of coils 1308 may be disposed on the first side 1302, the second side 1304, and/or a combination thereof. When the flexible substrate is a display device, the flexible substrate comprises and image panel and the matrix of coils 1308 may be formed using a transparent conducting material. Generally, the flexible substrate 1300 can be repeatedly transformed between a first or planar state and one or more non-planar states.

In a first type of transformation, FIG. 13B illustrates the flexible substrate/display 1300 in a non-planar state corresponding to a folded state in which the flexible substrate 1300 is folded along an axis of bending 1310. In the second state, the first side 1302 constitutes an inner side and the second side 1304 constitutes an outer side. The flexible substrate 1300 also may be reconfigured to intermediate states corresponding to different degrees of folding between the first state of FIG. 13A and the second state of FIG. 13B. In exemplary embodiments, the second state of the flexible substrate 1300 has at least one spatial region, such as the axis of bending 1310 that has a minimum radius of curvature that is less than 10 mm. Although shown substantially perpendicular to a first edge 1312 and a second edge 1314 of the flexible substrate, the matrix of coils 1308 may be configured to detect an axis of bending that forms an angle from 0-180° with the first edge 1312 and the second edge 1314. The matrix of coils 1308 may be configured to detect an axis of bending between any two edges, i.e. the first edge and a third edge 1316 or a fourth edge 1318.

The flexible substrate 1300 including the matrix of coils 1308 may be reconfigured to a non-planar state as illustrated in FIG. 13C, in which the flexible substrate 1300 in this example essentially is rolled. In the second or rolled state, the first side 1302 also constitutes an inner side and the second side 1304 also constitutes an outer side. Similarly, as in previous embodiments, in exemplary rolled embodiments the first side 1302 may be the viewing side 1306 and second side 1304 may be the non-viewing side or the first side 1302 may be the non-viewing side and second 1304 side may be the viewing side 1306. The flexible substrate 1300 also may be reconfigured to intermediate states corresponding to different degrees of rolling between the first state of FIG. 13A and the rolled state of FIG. 13C. Similarly, as in folded embodiments, the rolled state of the flexible substrate 1300 may have at least one spatial region 1320 that has a minimum radius of curvature that is less than 10 mm. It will also be appreciated that the matrix of coils 1308 may be used to detect other forms of flexing, for example, tri-folding or other multiple folds, asymmetrical or slanted axis folding, rolling from a corner, or others types of bending, flexing, curving, or rolling as may be suitable for any particular usage, storage, transport, or like application.

An aspect of the invention, therefore, is a shape sensor that includes a matrix of coils with a first subset of coils and a second subset of coils, and a controller coupled to the matrix of coils, wherein the controller is configured to generate and transmit an excitation signal to the first subset of coils and measure, on the second subset of coils, an induced signal, and wherein, the controller is configured to determine a spatial configuration of the second subset of coils relative to the first subset of coils based on the induced signal.

In exemplary embodiments, the controller of the shape sensor is configured to transmit data associated with the spatial configuration of the sensor.

In exemplary embodiments, the data associated with the spatial configuration of the sensor includes data representing at least one of the induced signals, an axis of bending, and degrees of rotation.

In exemplary embodiments, the first subset of coils and the second subset of coils are characterized by a mutual inductance coefficient and the induced signal is associated with the mutual inductance coefficient.

In exemplary embodiments, the mutual inductance coefficient corresponds to the spatial configuration of the matrix of coils.

In exemplary embodiments, each coil of the matrix of coils is characterized by a spiral geometry.

In exemplary embodiments, each coil of the first subset of coils is characterized by a spiral geometry.

In exemplary embodiments, each coil of the second subset of coils is characterized by a spiral geometry.

In exemplary embodiments, the controller includes a sensor driver configured to provide the excitation signal to the first subset of coils and a sensing circuit configured to determine, based on the induced signal, at least one of an axis of bending and degrees of rotation.

In exemplary embodiments, the excitation signal is characterized by a drive frequency less than a resonance frequency associated with the matrix of coils.

Another aspect of the invention is a method of determining a spatial configuration of a matrix of coils including exciting a first subset of coils of a matrix of coils; measuring an induced signal on a second subset of coils of a matrix of coils; and determining, by a controller, a spatial configuration of the first subset of coils relative to the second subset of coils based on the induced signal.

In exemplary embodiments, determining the spatial configuration includes transmitting, by the controller, data associated with the spatial configuration of the sensor.

In exemplary embodiments, the data associated with the spatial configuration of the sensor further includes at least one of the induced signals, an axis of bending, and degrees of rotation.

In exemplary embodiments, determining the spatial configuration includes accessing a linearity table, wherein the linearity table includes one or more induced signal and spatial configuration pairs that map a known spatial configuration to a known induced signal; and determining the spatial configuration using the linearity table.

In exemplary embodiments, each coil of the first subset and/or second subset of coils is characterized by a spiral geometry.

In exemplary embodiments, exciting the first subset of coils includes transmitting, by the controller, a control signal to a sensor driver; and transmitting, by the sensor driver in response to the control signal, an excitation signal to the first subset of coils.

In exemplary embodiments, measuring the induced signal on the second subset of coils includes receiving, by a sensing circuit coupled to the controller, the induced signal; and transmitting the induced signal to the controller.

In exemplary embodiments, exciting the first subset of coils includes exciting the first subset of coils at a drive frequency less than a resonance frequency associated with the matrix of coils.

In exemplary embodiments, determining the spatial configuration includes determining a mutual inductance coefficient, wherein the mutual inductance coefficient is associated with an inductive coupling between one or more coils of the first subset of coils and one or more coils of the second subset of coils; and determining, by the controller, the spatial configuration of the second subset of coils relative to the first subset of coils based on the mutual inductance.

Another aspect of the invention is a flexible display system including a flexible substrate including an image panel; and a shape sensor according to any of the embodiments described herein, wherein the shape sensor senses a state of flexing of the flexible substrate.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

Embodiments of the present invention relate to configurations and operation devices with a flexible substrate in which the spatial configuration may be used to interact with a device. Examples of such devices include mobile phones including smartphones, personal digital assistants (PDAs), tablets, laptop computers, public information displays, industrial controls, and the like.

REFERENCE SIGNS LIST

102—first coil
104—driver
106—second coil
107—surface
108—sensor
110—first direction
112—second direction
202—planar position
204—rotated position
206—axis of bending
300—diagram of measured output signal
302—y-axis
306—measured output signal
400—diagram of linearization of output signal
402—y-axis
404—x-axis
406—output signal
408—linearization
410—map
412—low angles
500—shape sensor system
502—flexible substrate
504—transmit coils
506—receive coils
510—transmit driver
512—receive sensor
514—controller
600—coil arrangement
602—first coil
604—second coil
606—third coil
700—circuit diagram
702—first electrical model of a coil
704—second electrical model of a coil
800—parallel coil arrangement
802—first coil
804—second coil
806—third coil
808—first terminal
810—first signal trace
812—second terminal
814—second signal trace
900—circuit
902—first coil
904—second coil
906—third coil
908—fourth coil
910—first signal trace
912—second signal trace
1000—first matrix
1002, 1006, 1010, 1014, 1018—first subset of transmit coils
1004, 1008, 1012, 1016—second subset of receive coils
1020—first subset of coils
1021—second matrix
1022—second subset of coils
1024—third matrix
1026—first subset of coils
1028—second subset of coils
1100—matrix
1102—first subset of coils
1104—second subset of coils
1106—first horizontal addressing line
1108—second horizontal addressing line
1110—third horizontal addressing line
1112—fourth horizontal addressing line
1114—first signal trace
1116—second signal trace
1118—first vertical addressing line
1120—second vertical addressing line
1122—third vertical addressing line
1124—fourth vertical addressing line 1200—matrix
1202—hexagonal coils
1300—flexible display system
1302—first side
1304—second side
1306—viewing direction
1308—matrix of coils
1310—axis of bending
1312—first edge
1314—second edge
1316—third edge
1318—fourth edge
1320—spatial region

The invention claimed is:

1. A shape sensor comprising:
a matrix of coils with a first subset of coils and a second subset of coils, wherein the first subset of coils are inductively coupled to the second subset of coils and the second subset of coils are repositionable relative to the first subset of coils between a planar state and a non-planar state; and
a controller coupled to the matrix of coils, wherein the controller is configured to generate and transmit an excitation signal to the first subset of coils and measure, on the second subset of coils, an induced signal, and wherein the controller is configured to determine a spatial configuration of the second subset of coils relative to the first subset of coils between the planar state and the non-planar state based on the induced signal.

2. The shape sensor of claim 1 wherein the controller is configured to transmit data associated with the spatial configuration of the sensor.

3. The shape sensor of claim 2 wherein the data associated with the spatial configuration of the sensor includes data representing at least one of the induced signals, an axis of bending, and degrees of rotation.

4. The shape sensor of claim 1 wherein the first subset of coils and the second subset of coils are characterized by a mutual inductance coefficient, and wherein the induced signal is associated with the mutual inductance coefficient.

5. The shape sensor of claim 4 wherein the mutual inductance coefficient corresponds to the spatial configuration of the matrix of coils.

6. The shape sensor of claim 1 wherein each coil of the matrix of coils is characterized by a spiral geometry.

7. The shape sensor of claim 1 wherein each coil of the first subset of coils is characterized by a spiral geometry.

8. The shape sensor of claim 1 wherein each coil of the second subset of coils is characterized by a spiral geometry.

9. The shape sensor of claim 1 wherein the controller further comprises:
a sensor driver configured to provide the excitation signal to the first subset of coils; and
a sensing circuit configured to determine, based on the induced signal, at least one of an axis of bending and degrees of rotation.

10. The shape sensor of claim 1 wherein the excitation signal is characterized by a drive frequency less than a resonance frequency associated with the matrix of coils.

11. A flexible display system comprising:
a flexible substrate including an image panel; and
a shape sensor according to claim 1, wherein the shape sensor senses a state of flexing of the flexible substrate.

12. A method of determining a spatial configuration of a matrix of coils comprising:
exciting a first subset of coils of a matrix of coils;
measuring an induced signal on a second subset of coils of a matrix of coils; and
determining, by a controller, a spatial configuration of the first subset of coils relative to the second subset of coils based on the induced signal;
wherein the first subset of coils are inductively coupled to the second subset of coils and the second subset of coils are repositionable relative to the first subset of coils between a planar state and a non-planar state, and the spatial configuration is determined by determining repositioning of the second subset of coils relative to the first subset of coils between the planar state and the non-planar state based on the induced signal.

13. The method of claim 12 further comprising transmitting, by the controller, data associated with the spatial configuration of the sensor.

14. The method of claim 13 wherein the data associated with the spatial configuration of the sensor further includes at least one of the induced signals, an axis of bending, and degrees of rotation.

15. The method of claim 12 wherein determining, by the controller, the spatial configuration of the first subset of coils relative to the second subset of coils based on the induced signal further comprises:
accessing a linearity table, wherein the linearity table includes one or more induced signal and spatial configuration pairs that map a known spatial configuration to a known induced signal; and
determining the spatial configuration using the linearity table.

16. The method of claim 12 wherein each coil of the first subset and/or second subset of coils is characterized by a spiral geometry.

17. The method of claim 12 wherein exciting the first subset of coils further comprises:
transmitting, by the controller, a control signal to a sensor driver; and
transmitting, by the sensor driver in response to the control signal, an excitation signal to the first subset of coils.

18. The method of claim 12 wherein measuring the induced signal on the second subset of coils further comprises:
receiving, by a sensing circuit coupled to the controller, the induced signal; and
transmitting the induced signal to the controller.

19. The method of claim 12 wherein exciting the first subset of coils further comprises exciting the first subset of coils at a drive frequency less than a resonance frequency associated with the matrix of coils.

20. The method of claim 12 further comprising:
determining, a mutual inductance coefficient, wherein the mutual inductance coefficient is associated with an inductive coupling between one or more coils of the first subset of coils and one or more coils of the second subset of coils; and
determining, by the controller, the spatial configuration of the second subset of coils relative to the first subset of coils based on the mutual inductance.

* * * * *